(12) United States Patent
Leong et al.

(10) Patent No.: US 9,891,311 B2
(45) Date of Patent: Feb. 13, 2018

(54) METHOD OF SECURE RF RANGING UNDER STRONG MULTIPATH REFLECTIONS

(71) Applicant: NXP B.V., Eindhoven (NL)

(72) Inventors: Frank Harald Erich Ho Chung Leong, Eindhoven (NL); Arie Geert Cornelius Koppelaar, Eindhoven (NL); Stefan Drude, Eindhoven (NL); Andries Peter Hekstra, Eindhoven (NL)

(73) Assignee: NXP B.V., Eindhoven (NL)

( * ) Notice: Subject to any disclaimer, the term of this patent is extended or adjusted under 35 U.S.C. 154(b) by 331 days.

(21) Appl. No.: 14/446,612

(22) Filed: Jul. 30, 2014

(65) Prior Publication Data

US 2016/0033637 A1    Feb. 4, 2016

(51) Int. Cl.
| | | |
|---|---|---|
| H04B 1/00 | (2006.01) |
| G01S 13/76 | (2006.01) |
| G01S 7/292 | (2006.01) |
| G01S 7/34 | (2006.01) |
| G01S 11/02 | (2010.01) |
| H03G 3/30 | (2006.01) |
| H04B 1/711 | (2011.01) |
| H04L 7/00 | (2006.01) |
| G01S 13/02 | (2006.01) |

(52) U.S. Cl.
CPC .......... *G01S 13/767* (2013.01); *G01S 7/2921* (2013.01); *G01S 7/34* (2013.01); *G01S 11/02* (2013.01); *G01S 13/76* (2013.01); *H03G 3/3042* (2013.01); *H03G 3/3052* (2013.01); *H03G 3/3073* (2013.01); *H04B 1/711* (2013.01); *H04L 7/0087* (2013.01); *G01S 13/0209* (2013.01); *G01S 13/765* (2013.01); *H04B 2201/709718* (2013.01)

(58) Field of Classification Search
CPC ..... H03G 3/3052; H03G 3/3068; H03G 3/301
See application file for complete search history.

(56) References Cited

U.S. PATENT DOCUMENTS

| | | | | |
|---|---|---|---|---|
| 5,734,974 A | * | 3/1998 | Callaway, Jr. ....... | H03G 3/3073 330/282 |
| 2005/0163081 A1 | * | 7/2005 | Aoki ................... | H03G 3/3052 370/334 |
| 2005/0221778 A1 | * | 10/2005 | Ishihara ............... | H03G 3/3068 455/234.1 |
| 2006/0068733 A1 | * | 3/2006 | Wang .................... | H04W 52/52 455/234.1 |

(Continued)

FOREIGN PATENT DOCUMENTS

| | | |
|---|---|---|
| DE | 914 946 C | 7/1954 |
| GB | 2 075 300 A | 11/1981 |

OTHER PUBLICATIONS

Extended European Search Report for EP Patent Appln. No. 15178725.6 (dated Jan. 8, 2016).

*Primary Examiner* — Shuwang Liu
*Assistant Examiner* — Sung Ahn
(74) *Attorney, Agent, or Firm* — Rajeev Madnawat (57) ABSTRACT

A receiver, including: a tuner receiving an input signal; a signal processor configured to process the input signal; an automatic gain control (AGC) controller configured to: initialize the receiver in a low gain state; determine the presence of a signal; and increase the receiver gain to determine if a weak signal is present prior to a strong signal.

21 Claims, 10 Drawing Sheets

(56) References Cited

U.S. PATENT DOCUMENTS

| | | | |
|---|---|---|---|
| 2007/0197178 A1* | 8/2007 | Gu | H03G 11/002 |
| | | | 455/232.1 |
| 2009/0080349 A1* | 3/2009 | Rofougaran | H04W 52/0261 |
| | | | 370/311 |
| 2011/0026571 A1* | 2/2011 | Han | H03G 3/3052 |
| | | | 375/224 |
| 2011/0294449 A1 | 12/2011 | Budianu et al. | |
| 2012/0208482 A1* | 8/2012 | Kogawa | H04B 17/318 |
| | | | 455/253.2 |
| 2012/0269080 A1 | 10/2012 | Giustiniano et al. | |

\* cited by examiner

METHOD OF SECURE RF RANGING UNDER STRONG MULTIPATH REFLECTIONS

BACKGROUND

Radio frequency (RF) ranging may be used to determine the distance between two objects. The time of flight of a transmitted signal may be used to measure the distance between two objects. Interference with the received signal, such as multipath, may degrade the accuracy of the measured distance between the two objects.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to a receiver, including: a tuner receiving an input signal; a signal processor configured to process the input signal; an automatic gain control (AGC) controller configured to: initialize the receiver in a low gain state; determine the presence of a signal; and increase the receiver gain to determine if a weak signal is present along with a strong signal.

Further, various exemplary embodiments relate to a receiver, including: a tuner receiving an input signal; a signal processor configured to process the input signal; an automatic gain control (AGC) controller configured to: initialize the receiver in a high gain state; lock onto a weak portion of the input signal when the input signal includes a strong signal portion; and maintaining the receiver gain in a high state to maintain the lock on the weak portion of the signal. The weak and strong portions of the signal are different portions of the input signal according to the time domain.

Further, various exemplary embodiments relate to a receiver, including: a tuner receiving an input signal; a signal processor configured to process the input signal; an automatic gain control (AGC) controller configured to: initialize the receiver in a high gain state; determine that the receiver is clipping; lock on the received signal; initiate the receipt of payload data.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Figure 1:
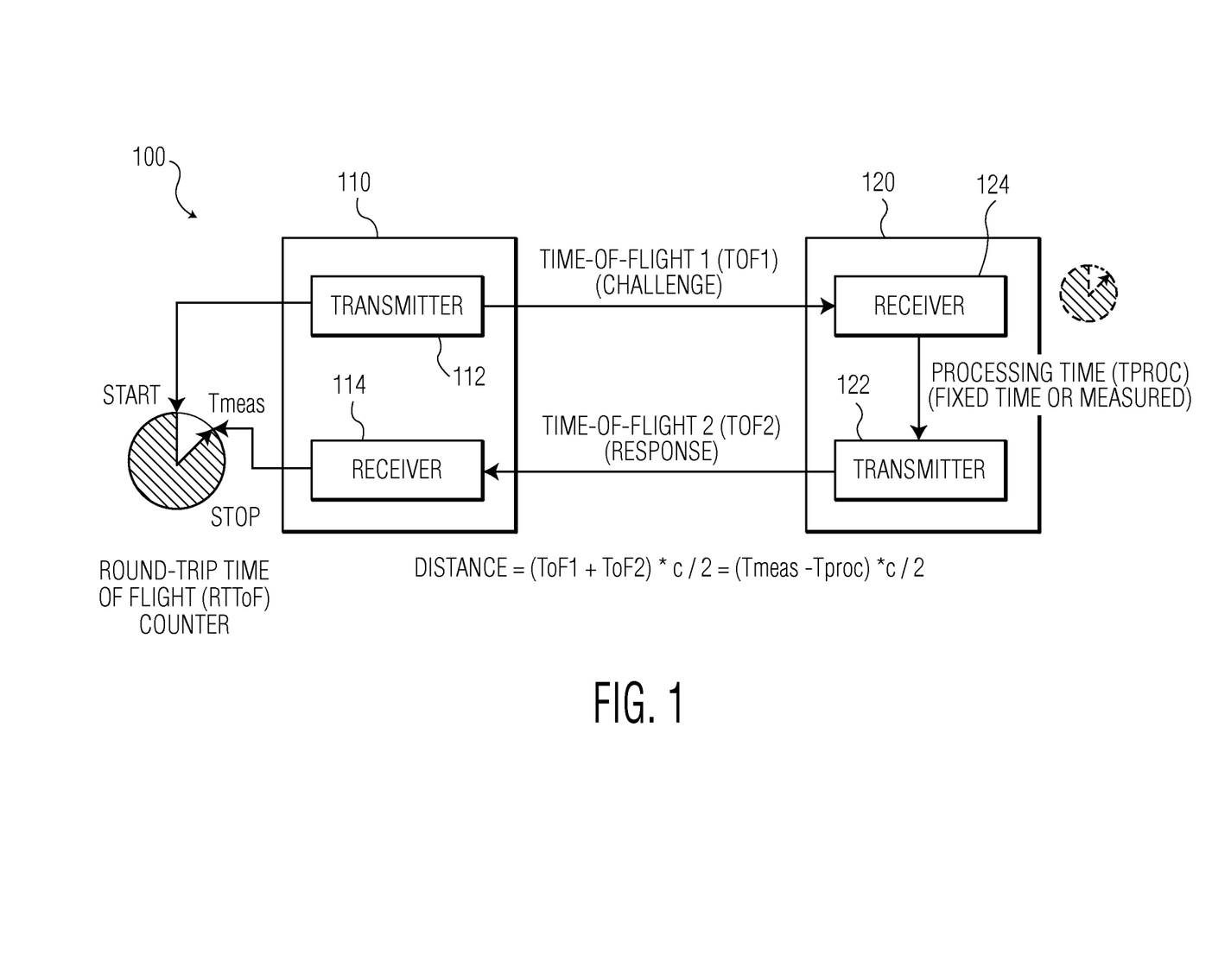
FIG. 1 illustrates an example of an RF ranging system that employs measuring the time-of-flight to determine the distance between two radios.

FIG. 1 illustrates an example of an RF ranging system that employs measuring the time-of-flight to determine the distance between two antennas associated with two radios. The system 100 may include a first radio 110 and a second radio 120. These radios may be part of larger objects where the distance between these objects is to be measured. The radios may be integrated into these objects or be part of tags placed on the objects. The first radio 110 includes a transmitter 112 and a receiver 114. Likewise, the second radio may include a receiver 124 and a transmitter 122. The transmitter 112 in the first radio 110 may transmit a waveform (commonly a chirp or a pulse) that may be received by the receiver 124 at the second radio 120. The second radio 120 then processes the received information ("challenge signal") and transmits a response using transmitter 122. The response signal is then received by the receiver 114 in the first radio 110. The first radio 110 determines the time between transmission and reception of the signals $T_{meas}$. The second radio 120 determines the time it takes the second radio to receive the challenge signal and transmit the response signal $T_{proc}$. The time $T_{proc}$ may be communicated by the second radio 120 to the first radio 110. Alternatively, $T_{proc}$ may also be known by the first radio 110 a priori. The round trip time of flight RTToF may be calculated as RTToF=$T_{meas}$−$T_{proc}$. Because the signal propagates at the speed of light the distance between the first radio 110 and the second radio may be calculated as:

$$\text{distance}=(T_{meas}-T_{proc})*c/2,$$

where c is the speed of light. It is noted that instead of two radios, a single radio may be used to operate as a RADAR where the transmitted signal bounces off of the second object whose distance is to be measured. Also, various separate transmitters and receivers may be used in a multistatic RADAR mode to measure the distance.

In operation the communication signal between the two radios may include ultra-wideband pulses. Such pulse may be part of a preamble used in the signaling protocol in order to lock onto a signal and to establish communication between the two radios, or the pulses may be the data payload carried by the communication signal. It is also possible to use pulses from both the preamble and the payload data to lock onto the signal. Further, a number of any such pulses may need to be received in order to establish the range between the radios and also to establish a lock on the signal. Once such lock is achieved, the signal payload may then be transmitted.

The system's performance will be limited by how much the radio signals are degraded as they travel from a transmitter to a receiver. Two common sources of degradation are attenuation and reflection due to the radio channel. Other sources include interference from other RF systems and thermal noise from various sources.

A typical radio receiver has a limited dynamic range in terms of the weakest signal it can detect versus the strongest signal it can allow without clipping and distortion. In advanced radio receivers, the supported signal amplitude range is adapted using automatic gain control (AGC) according to the strongest signal that is present at the receiver. This strategy avoids clipping and overloading of the receiver, but reduces sensitivity to weak signals in the presence of strong signals, which are commonly named blocker signals.

Figure 2:
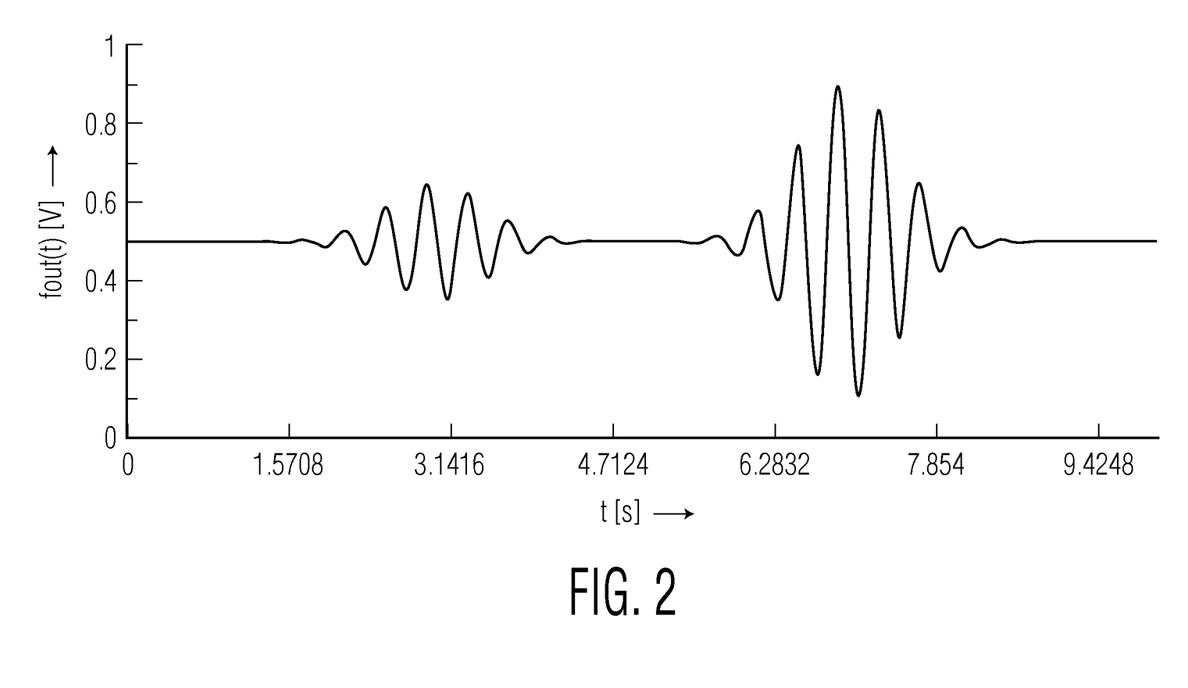
FIG. 2 is a plot of a received communication signal including a weak LOS pulse and a strong reflected pulse.

For example, in UWB radio systems, it is fairly common to encounter a situation where the direct line-of-sight (LOS) propagation is attenuated and a reflection in the radio channel causes a second pulse (multipath) to appear at the receiver for each transmitted pulse. It is not uncommon that the reflected pulse is stronger than a LOS pulse such as when the LOS path is strongly attenuated. FIG. 2 is a plot of a received communication signal including a weak LOS pulse and a strong reflected pulse. In such a case the receiver may use automatic gain control (AGC) to adjust the sensitivity of the receiver to correspond to the reflected pulses rather than the LOS pulses, because receivers are typically designed to lock on to the strongest matching signal. The consequence is that the receiver's sensitivity might be degraded by the reflected pulses to such an extent that the receiver is no longer able to detect the LOS pulses.

For a communication system, such operation is not a problem, as the system will simply adapt to perform bit detection on the reflected pulses. In a ranging system, however, the sensitivity reduction will lead to an error in the distance measurement because the reflected pulse will arrive later resulting in a distance calculation that is greater than the true distance. The embodiments described below seek to prevent such sensitivity reduction in ranging systems.

Figure 3:
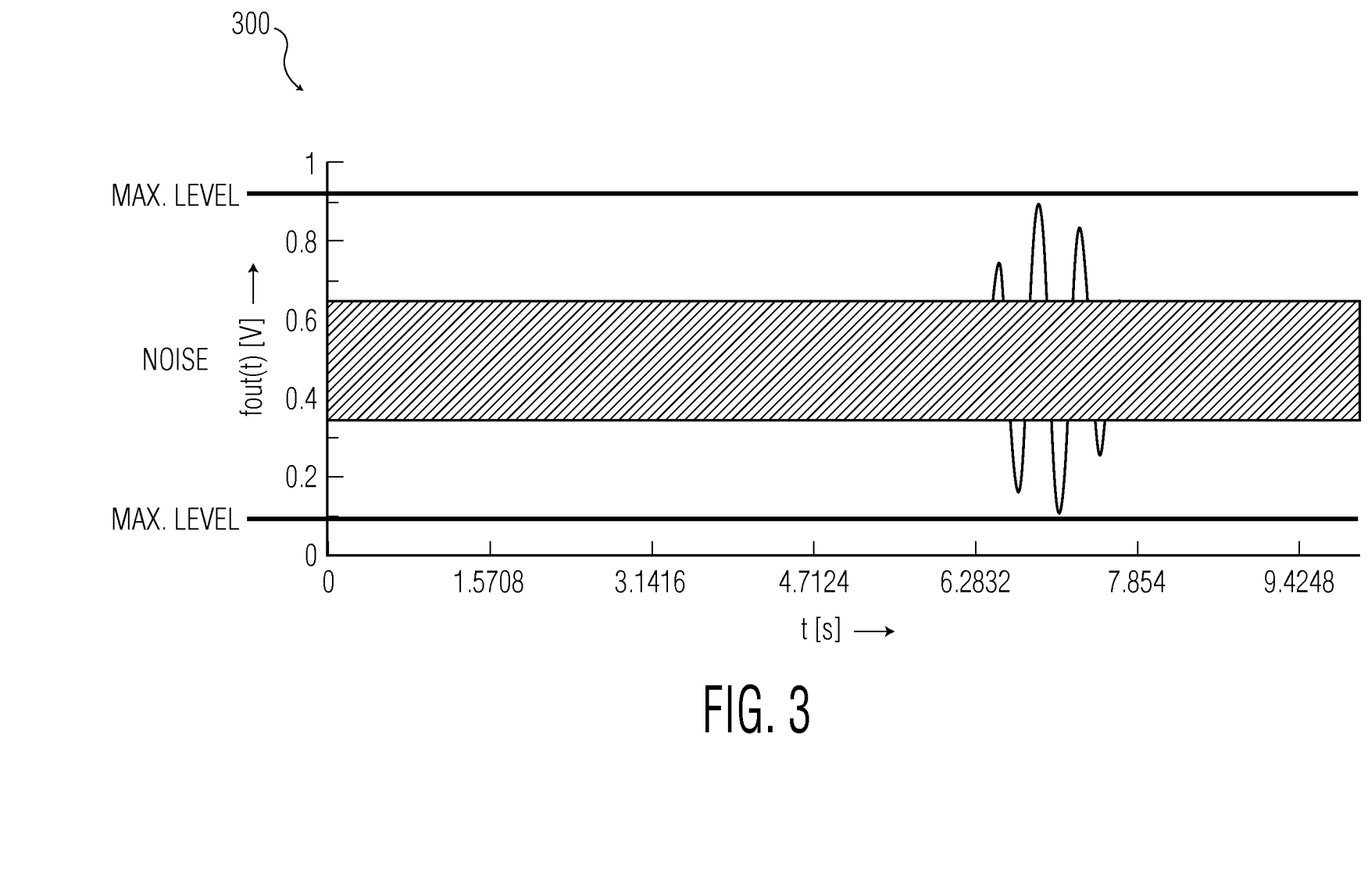
FIG. 3 illustrates the situation where the receiver sensitivity is set based upon the received stronger reflected pulse for the signal shown in FIG. 2.
Figure 4:
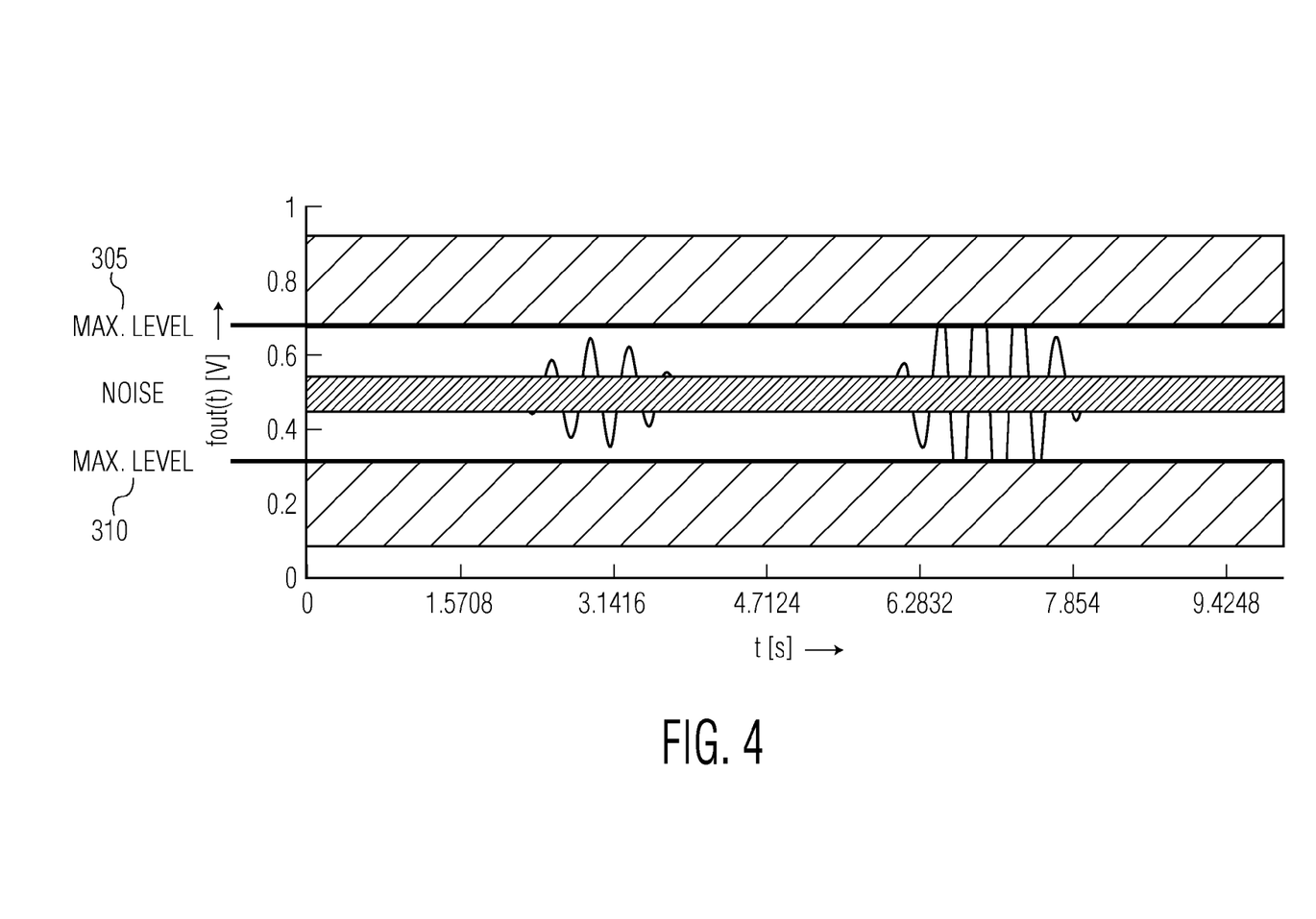
FIG. 4 illustrates the situation where the receiver sensitivity is increased for the signal shown in FIG. 2.

FIG. 3 illustrates the situation where the receiver sensitivity is set based upon the received stronger reflected pulse for the signal shown in FIG. 2. In this case the sensitivity or the gain is low. Accordingly the noise level is higher as illustrated by the band in the plot. The noise completely overcomes the LOS pulse, and hence the LOS pulse is not detected. The stronger reflected pulse has an amplitude greater than the noise so it is detected. FIG. 4 illustrates the situation where the receiver sensitivity is increased for the signal shown in FIG. 2. In this situation the noise level as shown is much lower and the LOS pulse is detectable. Further, because of the increased sensitivity and the dynamic range limits of the receiver, the stronger reflected pulse exceeds the maximum level detectable by the receiver causing the receiver to clip the stronger reflected pulse. The embodiments described below seek to set the AGC of the receiver system as shown in FIG. 4 so that LOS pulse can be detected in the presence of a stronger reflected pulse.

Different methods and implementations may be used to set the sensitivity as shown in FIG. 4 so that a weak LOS pulse may be detected in the presence of a strong reflected pulse. Below three of these methods are described along with a brief description of their relative merits. Note that these examples are based on simple pulse trains, but for those skilled in the art, it should be trivial to adapt them to more complex pulse sequences, such as those defined in IEEE 802.15.4a, or other communication protocols.

Figure 5:
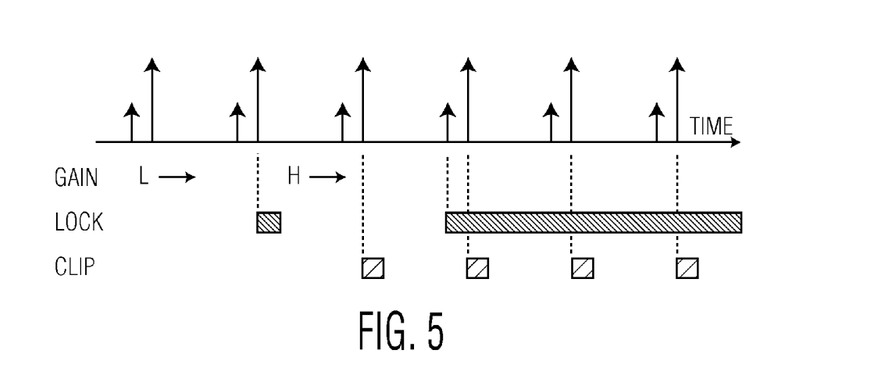
FIG. 5 illustrates the operation of the first method when a weak LOS pulse and a strong reflected pulse are received.
Figure 6:
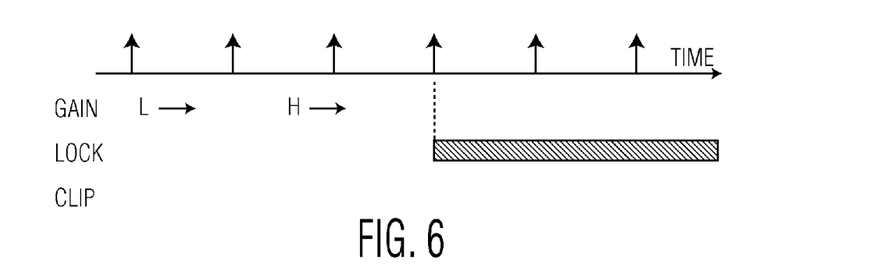
FIG. 6 illustrates the operation of the first method when only a weak LOS pulse is received.
Figure 7:
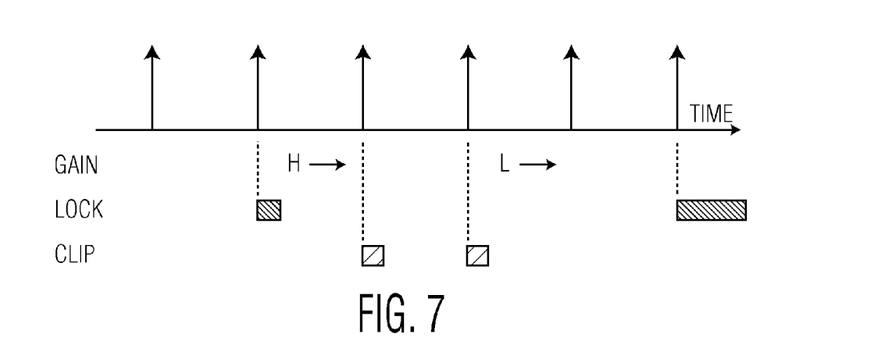
FIG. 7 illustrates the operation of the first method when only strong pulses are received.

In a first method, the receiver may use a low gain to first lock onto the preamble part of a packet without overloading, and then intentionally overload once in lock by increasing the gain to search for potential weak pulses preceding the strong pulses. Depending on whether or not such pulses are found, the receiver may switch back to a low gain to avoid overload or stay in the more sensitive mode with high gain to focus on the reception of weaker signals. The advantage of this method is that, under the assumption that any relevant weak pulses will appear shortly before large pulses, the receiver can limit its search window. This allows use of a duty-cycled analog-to-digital converter (ADC) and reduced memory for the search of a weak pulse, which may allow sensitivity improvements when ADC functionality and/or memory size are constrained by the system's cost or form factor. FIGS. 5, 6, and 7 illustrate the operation of this first method.

FIG. 5 illustrates the operation of the first method when a weak LOS pulse and a strong reflected pulse are received. In FIGS. 5-14, a sequence of received pulses is shown. Below the axis showing the pulses, the gain state, lock state, and clipping state for the receiver is shown. The receiver starts in a low gain configuration. When the second set of pulses is received the receiver locks onto the strong reflected pulse. The receiver then may transition into the high gain state. When the next pair of pulses is received, this results in the clipping in the receiver when the strong reflected pulse is received. Then when the next pair of pulses is received, the receiver locks onto the weak LOS pulse and the receiver is clipped when the strong reflected pulse is received. The receiver continues to operate in the high gain state because it has locked on to a weaker pulse that is received earlier in time, indicating that it is the LOS pulse rather than a reflected pulse.

FIG. 6 illustrates the operation of the first method when only a weak LOS pulse is received. Again, the receiver starts in a low gain configuration. After a few pulses are received and no lock is achieved, the receiver then may transition into the high gain state. Then after a few pulses are received, the receiver locks onto the weak LOS pulse. The receiver continues to operate in the high gain state because it has locked on to a weaker pulse.

FIG. 7 illustrates the operation of the first method when only strong pulses are received. Again, the receiver starts in a low gain configuration. When the second pulse is received the receiver locks onto the strong reflected pulse. The receiver then may transition into the high gain state. When the next pulses are received, this results in the clipping in the receiver. When the receiver fails to lock onto any pulse and the receiver is clipped when the strong reflected pulse is received, the gain is reduced. Then the receiver locks on to the strong pulse and continues to operate in the low gain state.

Figure 8:
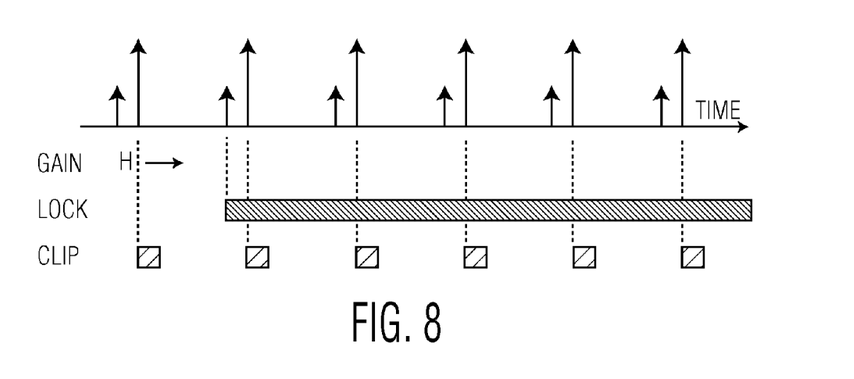
FIG. 8 illustrates the operation of the second method when a weak LOS pulse and a strong reflected pulse are received.
Figure 9:
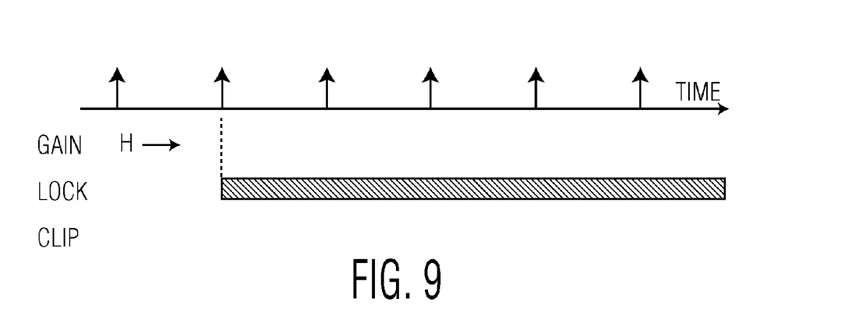
FIG. 9 illustrates the operation of the second method when only a weak LOS pulse is received.
Figure 10:
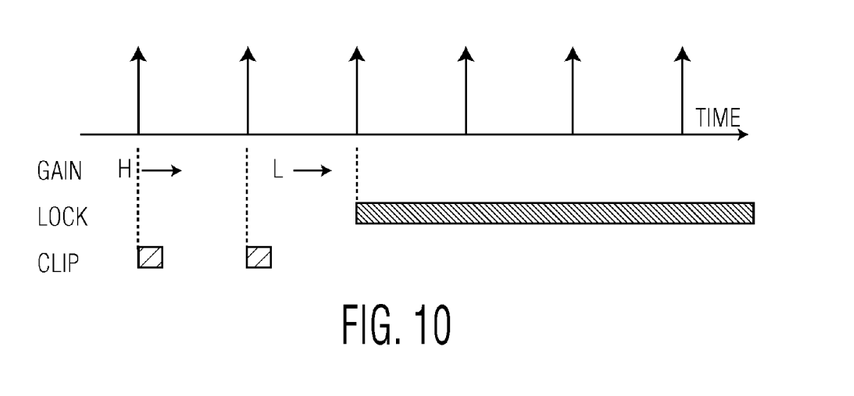
FIG. 10 illustrates the operation of the second method when only strong pulses are received.

In a second method, the receiver may start with a high gain or the most sensitive setting of the gain control system, and gate the overload detector (which is basically the signal from the peak detector that normally triggers gain reduction) with a signal indicating successful lock onto a weak pulse train. In this implementation, successful lock onto a weak signal would be the condition to prevent the system from reducing receiver sensitivity. This method achieves the fastest lock for weak signals, but also puts the toughest requirements on ADC and baseband memory. FIGS. 8, 9, and 10 illustrate the operation of this second method.

FIG. 8 illustrates the operation of the second method when a weak LOS pulse and a strong reflected pulse are received. The receiver starts in a high gain configuration. When the first set of pulses are received, the receiver clips the strong reflected pulse. Then when the second set of pulses is received the receiver locks onto the weak LOS pulse and still clips the strong reflected pulse. The receiver continues to operate in the high gain state because it has locked on to a weaker pulse that is received earlier in time, indicating that it is the LOS pulse rather than a reflected pulse.

FIG. 9 illustrates the operation of the second method when only a weak LOS pulse is received. Again, the receiver starts in a high gain configuration. After a few pulses are received, the receiver locks onto the weak LOS pulse. The receiver continues to operate in the high gain state because it has locked on to a pulse and no clipping is indicated so no other potential ranging pulse is present.

FIG. 10 illustrates the operation of the second method when only strong pulses are received. Again, the receiver starts in a high gain configuration. When the first pulses are received, the receiver clips the strong reflected pulse. Because the receiver clips the received pulses and no lock is achieved, the receiver may transition into the low gain state. When the next pulse is received, this results in the receiver locking onto the strong reflection pulse, and the receiver stays in the low gain state.

In a third method, it is noted that in extreme cases, the weak LOS pulse may still be able to overload the receiver. Also in this case, the second method described above would be beneficial, when implemented as a multi-stage gain approach. Again using a lock indicator, the amount of gain reduction that is applied may be limited such that stronger reflections do not affect sensitivity and thereby the Bit Error Rate (BER). In this case, disruption of the distance measurement due to the reflection would also be avoided by this method. This third method may be useful in when receiver needs to support a large range of signal amplitudes. FIGS. 11, 12, 13, and 14 illustrate the operation of this second method.

Figure 11:
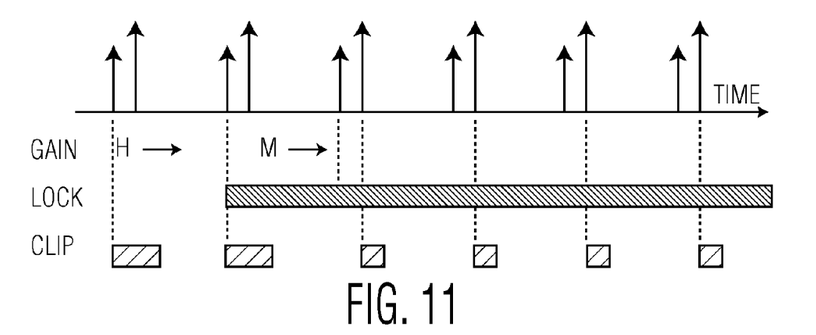
FIG. 11 illustrates the operation of the second method when a medium strength LOS pulse and a strong reflected pulse are received.

FIG. 11 illustrates the operation of the third method when a medium strength LOS pulse and a strong reflected pulse are received. The receiver starts in a high gain configuration. When the first set of pulses are received, the receiver clips both the medium strength LOS pulse and the strong reflected pulse. Then after a few sets of clipped pulses, the receiver may transition to a medium gain state. Then when the next set of pulses is received the receiver locks onto the medium strength LOS pulse and still clips the strong reflected pulse. The receiver continues to operate in the medium gain state because it has locked on to a weaker pulse that is received earlier in time, indicating that it is the LOS pulse rather than a reflected pulse.

Figure 12:
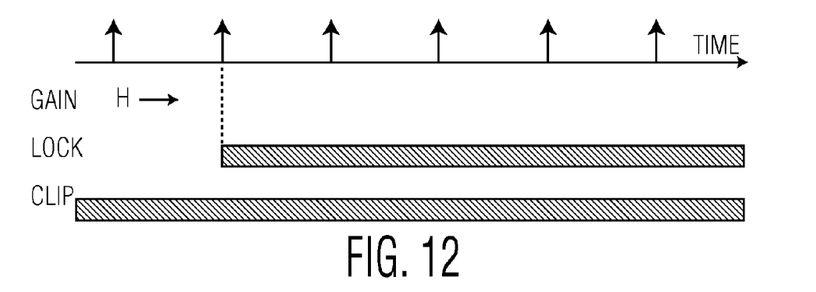
FIG. 12 illustrates the operation of the third method when only a weak LOS pulse is received.

FIG. 12 illustrates the operation of the third method when only a weak LOS pulse is received. Again, the receiver starts in a high gain configuration. After a few pulses are received, the receiver locks onto the weak LOS pulse. The receiver continues to operate in the high gain state because it has locked on to a pulse and no clipping is indicated so no other potential ranging pulse is present.

Figure 13:
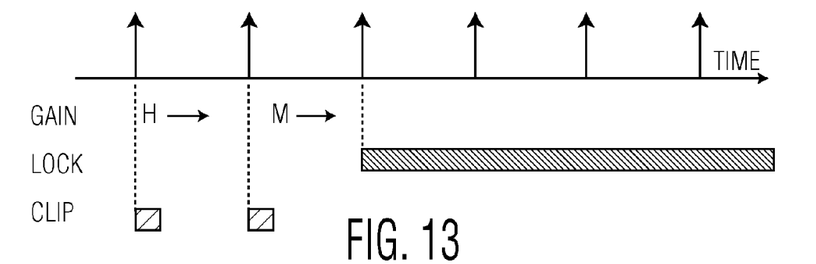
FIG. 13 illustrates the operation of the third method when only a medium strength LOS pulse is received.

FIG. 13 illustrates the operation of the third method when only a medium strength LOS pulse is received. Again, the receiver starts in a high gain configuration. When the first pulses are received, the receiver clips the strong reflected pulse. Because the receiver clips the received pulses and no lock is achieved, the receiver may transition into the medium gain state. After a few pulses are received, the receiver locks onto the medium strength LOS pulse. The receiver continues to operate in the medium gain state because it has locked on to a pulse and no clipping is indicated so no other potential ranging pulse is present.

Figure 14:
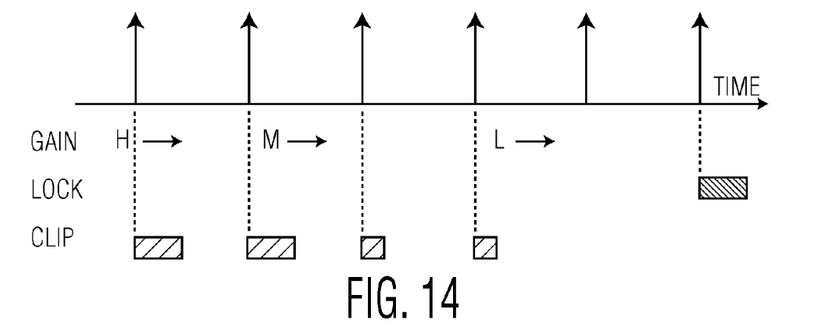
FIG. 14 illustrates the operation of the third method when only a strong reflection pulse is received.

FIG. 14 illustrates the operation of the third method when only a strong reflection pulse is received. Again, the receiver starts in a high gain configuration. When the first pulses are received, the receiver clips the strong reflected pulse. Because the receiver clips the received pulses and no lock is achieved, the receiver may transition into the medium gain state. When the next pulses are received, the receiver still clips the strong reflected pulse. Because the receiver clips the received pulses and no lock is achieved, the receiver may transition into the low gain state. When the next few pulses are received, the receiver locks onto the strong pulse, and the receiver stays in the low gain state.

Figure 15:
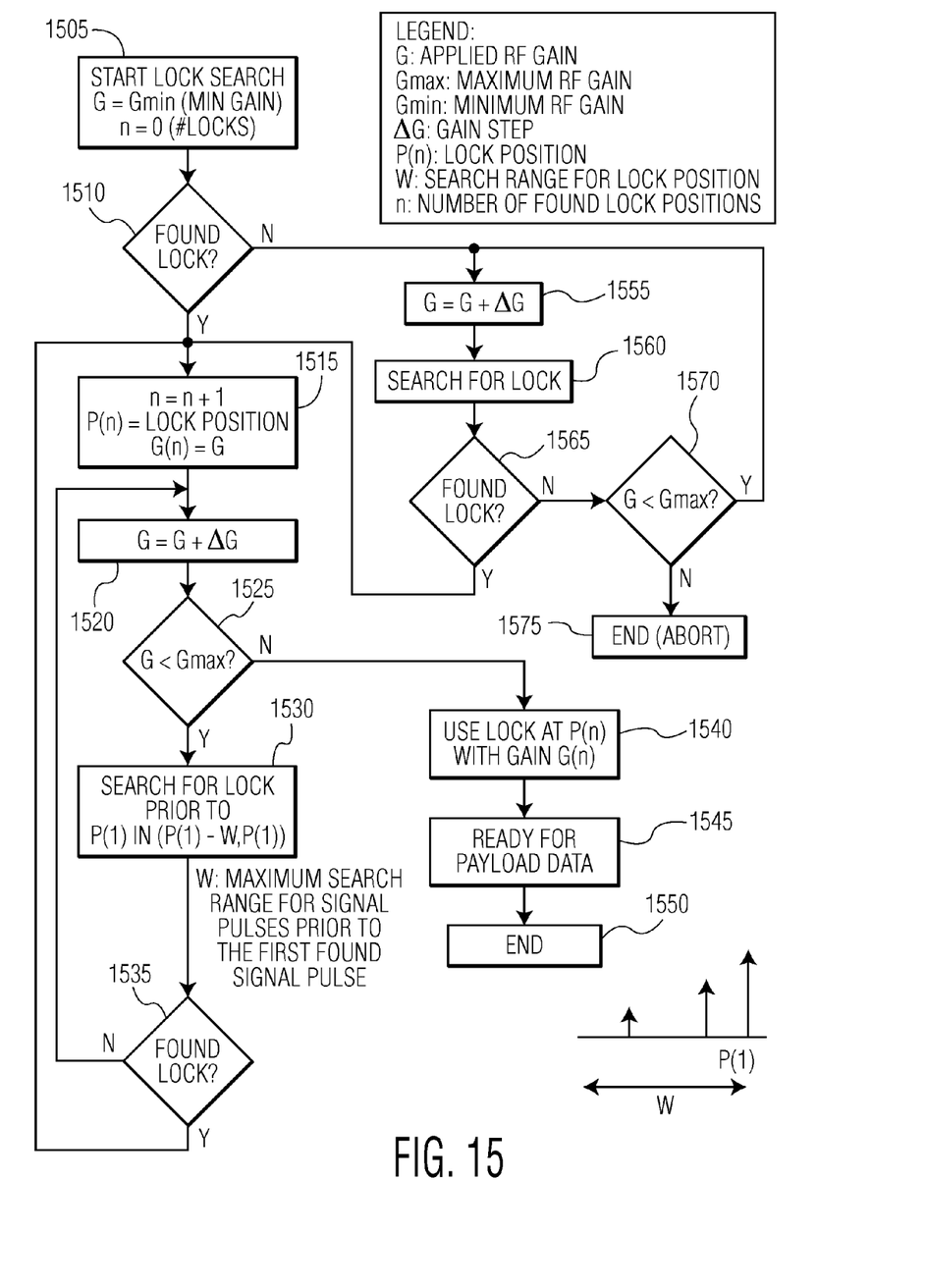
FIG. 15 illustrates a flow diagram showing the operation of a receiver that starts with a low receiver gain.

FIG. 15 illustrates a flow diagram showing the operation of a receiver that starts with a low receiver gain. This flow diagram may be used to describe the first method discussed above. The receiver starts with a low receiver gain and sets the number of locks to zero 1505. Then the receiver determines if it has locked onto a pulse in the received signal 1510. If so, the receiver increments the number of locks, stores the lock position just found, and stores the gain associated with the found lock position 1515. Next, the receiver then increases the receiver gain 1520. Then the receiver determines if the incremented gain is less than the maximum gain Gmax 1525. If so, then the receiver searches for a lock prior to the current lock 1530. This lock searches back in an interval of time defined by W as shown in FIG. 15. Next, the receiver determines if a lock is found 1535. If so, then the receiver returns to step 1515. If not, then the receiver returns to step 1520.

If the gain is not less than Gmax 1525, then the receiver knows that it has found the lock on the LOS pulse which will be the earliest pulse locked onto. The receiver uses the lock at P(n) and set the gain to G(n) 1540. The receiver is then ready for payload data 1545, and then ends at 1550.

If lock is not found at step 1510, the gain is increased 1555. Then the receiver searches for a lock 1560. The receiver then determines if a lock is found 1565. Such lock may be accomplished using a statistical test to detect the presence of a signal. For example, if the noise has a standard deviation $\sigma$ which corresponds to a noise energy of $\sigma^2$, then a test may be accomplished based upon the noise characteristics. The energy of the received signal over a time interval is determined and compared to a threshold $C\sigma^2$ to determine if a signal is present. Alternatively, the peak of the received signal could be compared to a threshold $C\sigma$ to determine if a signal is present. The value of C is selected to achieve a desired false alarm rate based upon the noise and channel characteristics. If the receiver determines that there is a lock, the receiver proceeds to step 1515. If not, then the receiver determines if the incremented gain is less than Gmax. If so, the receiver proceeds to step 1555. If not, then the receiver aborts operation 1575.

Figure 16:
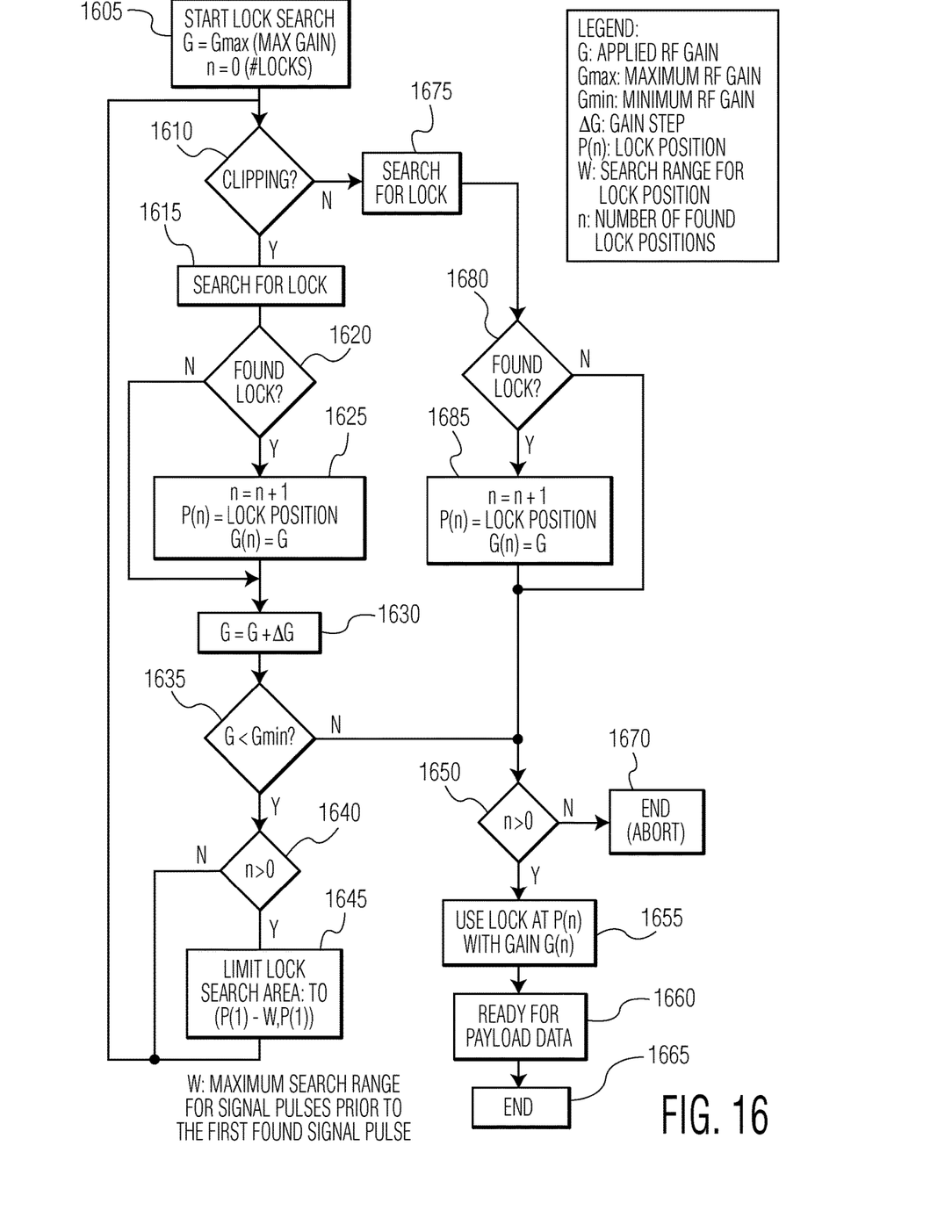
FIG. 16 illustrates a flow diagram showing the operation of a receiver that starts with a high receiver gain.

FIG. 16 illustrates a flow diagram showing the operation of a receiver that starts with a high receiver gain. This flow diagram may be used to describe the second and third methods discussed above. The receiver starts with a high receiver gain and sets the number of locks to zero 1605. Then the receiver determines if it has clipped a received signal 1610. If so, the receiver searches for a lock 1615. Next, the receiver determines if a lock is found. If so, then the receiver increments the number of locks, stores the lock position just found, and stores the gain associated with the found lock position 1625. Then the receiver decreases the gain 1630. If a lock is not found at step 1620, the receiver proceeds to step 1630 and decreases the gain.

After decreasing the gain, the receiver determines if the gain is greater than the minimum gain Gmin. If so, the receiver determines if the number of locks is greater than zero 1640. If so, the receiver limits the search area for looking for locks to an interval of time W before the most recent lock as previously described 1645. The receiver then continues to step 1610. If the number of locks is not greater than zero the receiver proceeds to step 1610.

If the gain is not greater than Gmin at step 1635, then the receiver determines if the number of locks is greater than zero 1650. If not, then the receiver aborts the method 1670. If the number of locks is greater than zero at step 1650, then the receiver knows that it has found the lock on the LOS pulse which will be the earliest pulse locked onto. The receiver uses the lock at P(n) and set the gain to G(n) 1655. The receiver is then ready for payload data 1660, and then ends at 1665.

If there is not clipping at step 1610, the receiver searches for a lock 1675. The receiver then determines if a lock is found. If so, then, the receiver increments the number of locks, stores the lock position just found, and stores the gain associated with the found lock position 1685. The receiver then proceeds to step 1650. If the receiver does not find a lock at step 1680, then the receiver proceeds to step 1650.

Figure 17:
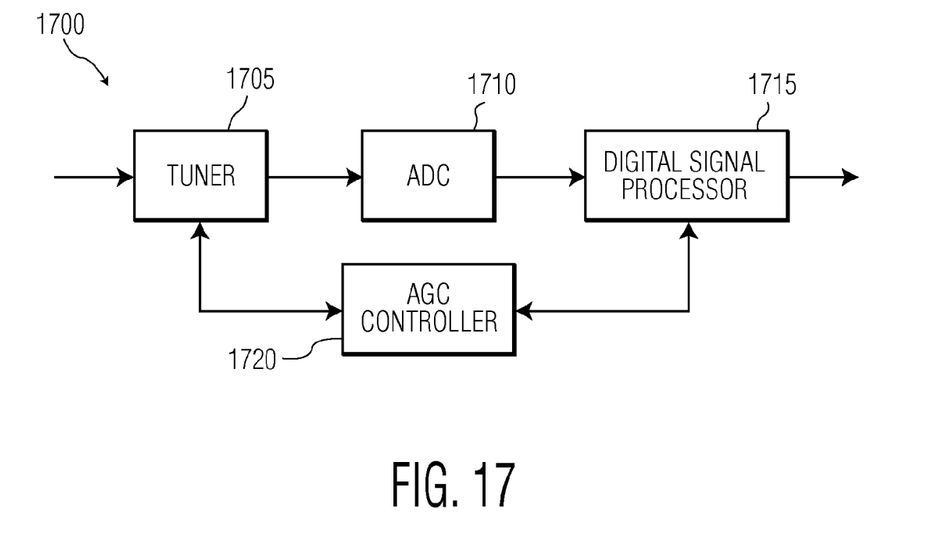
FIG. 17 illustrates a receiver that implements the methods described above.

FIG. 17 illustrates a receiver that implements the methods described above. The receiver 1700 may include a tuner 1705, ADC 1710, digital signal processor 1715, and an AGC controller 1720. The tuner 1705 tunes the receiver 1700 to a specific frequency to receive an input signal and may convert the received signal to a baseband signal. The ADC 1710 receives the baseband signal and samples it to produce a digital signal representing the baseband signal. The digital signal processor 1715 receives the digital signal and performs digital signal processing on the digital signal. The AGC controller 1720 receives signal information regarding the received signal from the tuner 1705 and the digital signal processor 1715 and also provides AGC control signals to control the AGC applied at the tuner 1705 and the digital signal processor 1715.

The tuner may include variable/programmable amplifiers (VGAs, PGAs), level detectors, filters, and radio frequency (RF) mixers. The amplifiers may be used to set the gain of the receiver 1700 based upon AGC controls. Further, the level detectors may detect the level of the received signal and provide signal level information to the AGC controller. The RF mixer may be used to mix the received signal down to a baseband signal. The tuner 1705 may include various circuit elements and may be implemented as combination of different integrated circuits (IC), as a single IC, or as a part of a receiver IC.

The digital signal processor 1715 may include various digital functions, for example, level detectors and a gain function. The level detectors may detect the level of the digital signal and provide such level information to the AGC controller 1720. Also, the gain function may apply AGC to the digital signal based upon AGC controls from the AGC controller 1720. The digital signal processor 1715 may include various circuit elements and may be implemented as a combination of different integrated circuits (IC), as a single IC, as a part of a receiver IC. Further, the digital signal processor may be implemented using executable computer instructions running on a processor. The processor may be any type of processor include general purpose processors, signal processors, graphics processors, or application specific ICs (ASICs).

The AGC controller 1720 implements automatic gain control for the receiver 1700. The AGC controller may include various logic and circuits providing AGC control signals to the tuner 1705 and the digital signal processor 1715. The AGC controller 1720 may receive level information from the tuner 1705 and the digital signal processor 1715 which may be used to determine the desired gain of the receiver 1700. This desired gain is then communicated to the tuner 1705 and digital signal processor 1715 which is used to adjust the gain and sensitivity of the receiver 1700. The AGC controller 1720 may implement the methods of AGC described above for a ranging mode where there is a preference for signals received along the LOS path. Also, the ACG control may implement a normal AGC method for a normal communication mode that seeks to lock onto the strongest received signal which may be a reflected signal. Accordingly, the AGC controller may switch between these two modes depending on the needs of the communication system. The AGC controller 1720 may include various circuit elements and may be implemented as a combination of different integrated circuits (IC), as a single IC, or as a part of a receiver IC. Further, the digital signal processor may be implemented using executable computer instructions running on a processor. The processor may be any type of processor include general purpose processors, signal processors, graphics processors, or application specific ICs (ASICs).

Figure 18:
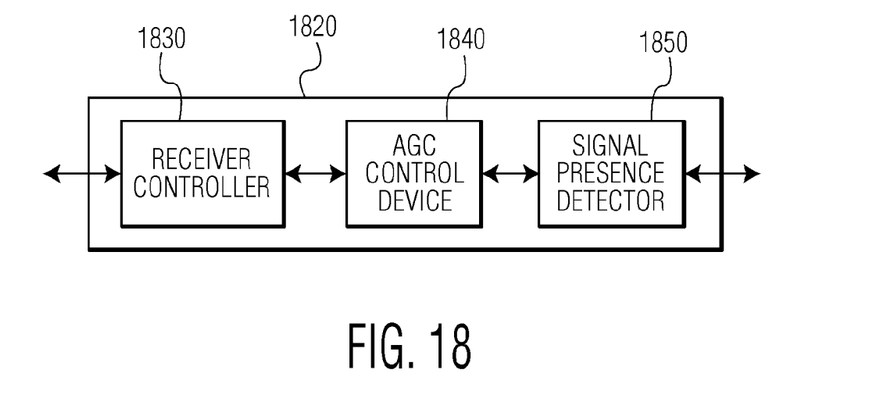
FIG. 18 illustrates an embodiment of the AGC controller.

FIG. 18 illustrates an embodiment of the AGC controller. The AGC controller 1820 may correspond to the AGC controller 1720 in FIG. 17. The AGC controller 1820 may include a receiver controller 1830, AGC control device 1840, and signal presence detector 1850. The receiver controller 1830 may send control signals to the tuner 1705 to control the gain in the tuner and to digital signal processor 1715 to control the processing gain. Further, the receiver controller 1830 may receive level information from the tuner 1705 and the digital signal processor 1715 which may be used to determine the desired gain of the receiver 1700. This desired gain is then communicated to the tuner 1705 and digital signal processor 1715 which is used to adjust the gain and sensitivity of the receiver 1700. The signal presence detector 1850 receives an indication from the digital signal processor 1715 that a signal has been detected which them may initiate the AGC algorithms. The AGC controller 1820 may implement the methods of AGC described above for a ranging mode where there is a preference for signals received along the LOS path. Also, the ACG controller 1820 may implement a normal AGC method for a normal communication mode that seeks to lock onto the strongest received signal which may be a reflected signal. Accordingly, the AGC controller 1820 may switch between these two modes depending on the needs of the communication system. The AGC controller 1820 may include various circuit elements and may be implemented as a combination of different integrated circuits (IC), as a single IC, or as a part of a receiver IC. Further, the digital signal processor may be implemented using executable computer instructions running on a processor. The processor may be any type of processor include general purpose processors, signal processors, graphics processors, or application specific ICs (ASICs).

It should be noted that various aspects of the above embodiments may be combined resulting in other embodiments. Also, various steps in the methods may be performed in a different order or simultaneously. Also various aspects of the embodiments above may be implemented using processors and computer instructions to result in a specific machine implementing the embodiment. Also, portions of the embodiments above may be implemented using ASICs or other specific hardware elements.

As used herein, the term "processor" will be understood to encompass a variety of devices such as microprocessors, field-programmable gate arrays (FPGAs), application-specific integrated circuits (ASICs), and other similar processing and computing devices.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A receiver, comprising:
a tuner configured to receive an input signal;
a signal processor configured to process the input signal;
an automatic gain control (AGC) controller configured to: initialize the receiver in a low gain state; determine a presence of the input signal; and increase receiver gain to determine if a weak signal is present prior to a strong signal within the input signal.

2. The receiver of claim 1, wherein the AGC controller is configured to have a ranging mode and a normal communication mode.

3. The receiver of claim 1, wherein determining the presence of the input signal includes determining that the receiver locks on to the input signal.

4. The receiver of claim 3, wherein the receiver is configured to increment a lock counter, store a lock position, and store the receiver gain at this lock position.

5. The receiver of claim 4, wherein the receiver is configured to, after increasing the receiver gain, determine that the receiver gain is less than a maximum receiver gain, search for a lock prior to a current lock, determine that the prior lock is found, increment a lock counter, store a lock position, and store the receiver gain at this lock position.

6. The receiver of claim 4, wherein the receiver is configured to, after increasing the receiver gain, determine that the receiver gain is less than a maximum receiver gain, search for a lock prior to a current lock, determine that the prior lock is not found, and further increase the receiver gain.

7. The receiver of claim 4, wherein the receiver is configured to, after increasing the receiver gain, determine that the receiver gain is not less than a maximum receiver gain, lock the receiver to a most recent lock position, set the receiver gain to a most recent receiver gain, and configure the receiver to receive payload data.

8. The receiver of claim 1, wherein the receiver is configured to determine that the receiver does not lock onto the input signal.

9. The receiver of claim 8, wherein the receiver is configured to, after increasing the receiver gain, search for a lock, determine that the lock is found, increment a lock counter, store a lock position, and store the gain at this lock position.

10. The receiver of claim 8, wherein the receiver is configured to, after increasing the receiver gain, search for a lock, determine that the lock is not found, and determine that the increased receiver gain is not less than a maximum receiver gain.

11. The receiver of claim 8, wherein the receiver is configured to, after increasing the receiver gain, search for a lock, determine that the lock is found, and further increase the receiver gain.

12. A receiver, comprising:
a tuner configured to receive an input signal;
a signal processor configured to process the input signal;
an automatic gain control (AGC) controller configured to: initialize the receiver in a high gain state; lock onto a weak portion of the input signal when the input signal includes both the weak portion and a strong portion, wherein the weak portion is received prior to the strong portion; and maintain receiver gain in a high state to maintain the lock on the weak portion of the input signal.

13. The receiver of claim 12, wherein the AGC controller is configured to have a ranging mode and a normal communication mode.

14. The receiver of claim 12, wherein locking onto the weak portion of the input signal when the input signal includes the strong portion includes:
determining the receiver is clipping.

15. The receiver of claim 14, wherein locking onto the weak portion of the input signal when the input signal includes the strong portion further includes:
searching for a lock;
determining that the lock is found;
incrementing a lock counter, storing a lock position and storing the receiver gain at this lock position; and
further decreasing the receiver gain.

16. The receiver of claim 14, wherein locking onto the weak portion of the input signal when the input signal includes the strong portion further includes:
  searching for a lock;
  determining that the lock is found;
  incrementing a lock counter, storing a lock position, and storing the receiver gain at this lock position;
  further decreasing the receiver gain;
  determining that the receiver gain is greater than a minimum receiver gain;
  determining that a number of locks is greater than zero;
  limiting a lock search area; and
  further determining if the receiver is clipping.

17. The receiver of claim 14, wherein locking onto the weak portion of the input signal when the input signal includes the strong portion further includes:
  searching for a lock;
  determining that the lock is found;
  incrementing a lock counter, storing a lock position, and storing the receiver gain at this lock position;
  further decreasing the receiver gain;
  determining that the receiver gain is greater than a minimum receiver gain;
  determining that a number of locks is not greater than zero; and
  further determining if the receiver is clipping.

18. The receiver of claim 14, wherein locking onto the weak portion of the input signal when the input signal includes the strong portion further includes:
  searching for a lock;
  determining that the lock is found;
  incrementing a lock counter, storing a lock position, and storing the receiver gain at this lock position;
  further decreasing the receiver gain;
  determining that the receiver gain is not greater than a minimum receiver gain;
  determining that a number of locks is greater than zero;
  locking the receiver to a most recent lock position and setting the receiver gain to a most recent receiver gain; and
  configuring the receiver to receive payload data.

19. The receiver of claim 12, wherein locking onto the weak portion of the input signal when the input signal includes the strong portion includes:
  determining the receiver is not clipping.

20. The receiver of claim 19, wherein locking onto the weak portion of the input signal when the input signal includes the strong portion further includes:
  searching for a lock;
  determining that the lock is found;
  incrementing a lock counter, storing a lock position, and storing the receiver gain at this lock position;
  determining that a number of locks is greater than zero;
  locking the receiver to a most recent lock position and setting the receiver gain to a most recent receiver gain; and
  configuring the receiver to receive payload data.

21. The receiver of claim 19, wherein locking onto the weak portion of the input signal when the input signal includes the strong portion further includes:
  searching for a lock;
  determining that the lock is found;
  determining that a number of locks is greater than zero;
  locking the receiver to a most recent lock position and setting the receiver gain to a most recent receiver gain; and
  configuring the receiver to receive payload data.

* * * * *